(12) United States Patent
Mustapha

(10) Patent No.: US 9,361,414 B2
(45) Date of Patent: Jun. 7, 2016

(54) HYBRID LOCAL NONMATCHING METHOD FOR MULTIPHASE FLOW SIMULATIONS IN HETEROGENEOUS FRACTURED MEDIA

(71) Applicant: Schlumberger Technology Corporation, Sugar Land, TX (US)

(72) Inventor: Hussein Mustapha, Abingdon (GB)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 277 days.

(21) Appl. No.: 13/962,981

(22) Filed: Aug. 9, 2013

(65) Prior Publication Data

US 2014/0046636 A1 Feb. 13, 2014

Related U.S. Application Data

(60) Provisional application No. 61/681,910, filed on Aug. 10, 2012.

(51) Int. Cl.
| | |
|---|---|
| *G06F 17/10* | (2006.01) |
| *G06F 7/60* | (2006.01) |
| *G06G 7/50* | (2006.01) |
| *G06G 7/58* | (2006.01) |

(Continued)

(52) U.S. Cl.
CPC ............ *G06F 17/5018* (2013.01); *E21B 41/00* (2013.01); *E21B 43/26* (2013.01); *G01V 1/30* (2013.01); *G01V 1/301* (2013.01); *G01V 2210/646* (2013.01)

(58) Field of Classification Search
CPC ...... G01V 1/30; G01V 1/301; G01V 17/5018; G01V 2210/646; E21B 41/00; E21B 43/26
USPC .................................................. 703/2, 9, 10
See application file for complete search history.

(56) References Cited

U.S. PATENT DOCUMENTS

| | | | |
|---|---|---|---|
| 5,949,425 | A | 9/1999 | Willis |
| 6,445,390 | B1 | 9/2002 | Aftosmis et al. |

(Continued)

FOREIGN PATENT DOCUMENTS

| | | |
|---|---|---|
| WO | 2010111398 A2 | 9/2010 |
| WO | 2013043531 A1 | 3/2013 |

OTHER PUBLICATIONS

Karimi-Fard et al., "An Efficient Discrete-Fracture Model Applicable for General-Purpose Reservoir Simulators," SPE79699 Journal 9 (2): 2006; 11 pages.

(Continued)

*Primary Examiner* — Kamini S Shah
*Assistant Examiner* — Andre Pierre Louis
(74) *Attorney, Agent, or Firm* — Colin L. Wier

(57) ABSTRACT

Systems, methods, and computer-readable media are provided for modeling a fractured medium. The method includes generating, using a processor, a grid for the fractured medium, the fractured medium defining a first fracture and a second fracture, with the first fracture and the second fracture each represented by fracture cells in the grid. The method also includes determining a location where the first and second fractures intersect, the location being at least partially represented by an intersection cell of the fracture cells of the grid. The method further includes redistributing areas of the intersection cell and at least one other fracture cell, such that a size of the intersection cell is increased.

20 Claims, 11 Drawing Sheets

(51) Int. Cl.
*G06F 17/50* (2006.01)
*E21B 41/00* (2006.01)
*G01V 1/30* (2006.01)
*E21B 43/26* (2006.01)

(56) References Cited

U.S. PATENT DOCUMENTS

| | | | |
|---|---|---|---|
| 6,842,725 | B1 | 1/2005 | Sarda |
| 7,480,205 | B2 | 1/2009 | Wei |
| 7,603,265 | B2 | 10/2009 | Mainguy et al. |
| 7,925,482 | B2 | 4/2011 | Kennon et al. |
| 7,979,257 | B2 | 7/2011 | Yu et al. |
| 8,200,465 | B2 | 6/2012 | Suarez-Rivera et al. |
| 8,315,845 | B2 | 11/2012 | Lepage |
| 2003/0078733 | A1* | 4/2003 | Stone ............ G01V 11/00 702/13 |
| 2003/0216897 | A1 | 11/2003 | Endres et al. |
| 2007/0016389 | A1* | 1/2007 | Ozgen ............ E21B 49/00 703/10 |
| 2008/0133186 | A1* | 6/2008 | Li ............ G06F 17/5018 703/2 |

OTHER PUBLICATIONS

Sandve et al., "An Efficient Multi-Point Flux Approximation Method for Discrete Fracture-Matrix Simulations," Journal of Computational Physics 231 (9): 2012; pp. 3784-3800.
Wheeler et al., "Enhanced Velocity Mixed Finite Element Methods for Flow in Multiblock Domains," Computational Geosciences: 6 (2002); pp. 315-332.
Official Action issued in related French Application No. FR 1357938, on Nov. 27, 2013 and agent's English translation thereof, 3 pages.
Combination Search and Examination Report issued in related UK Application No. GB 1314205.4, on Jan. 17, 2014, 10 pages.
Examination Report issued in corresponding UK application No. GB 1314205.4, on Dec. 11, 2014, 4 pages.

* cited by examiner

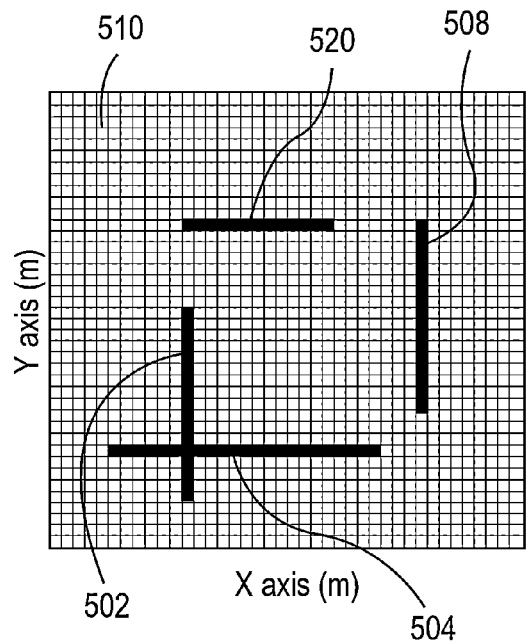
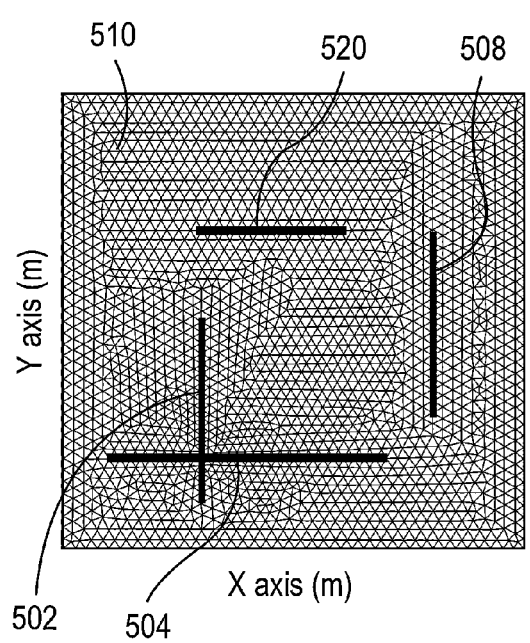
FIG. 11A  FIG. 11B
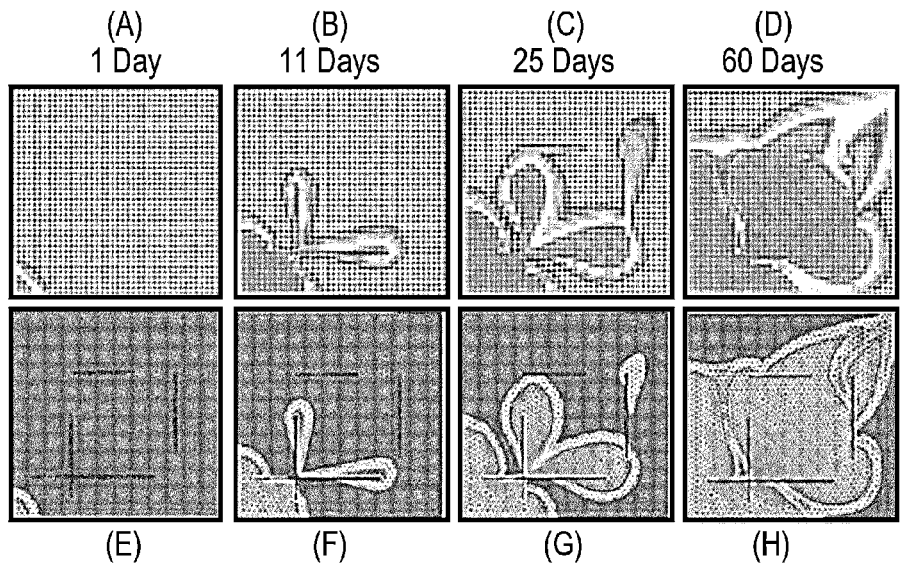
FIG. 12

HYBRID LOCAL NONMATCHING METHOD FOR MULTIPHASE FLOW SIMULATIONS IN HETEROGENEOUS FRACTURED MEDIA

CROSS-REFERENCE TO RELATED APPLICATIONS

This application claims the benefit of a related U.S. Provisional Application Ser. No. 61/681,910, filed on Aug. 10, 2012, which is incorporated by reference herein in its entirety.

BACKGROUND

Petroleum reservoirs, aquifers, and other geological features may be highly heterogeneous in composition and may generally include preferential flow paths resulting from natural fracture networks formed therein. Simulating the flow of fluid in these features can provide valuable information, for example, to well operators, drilling service provides, etc.

A reservoir or aquifer can be represented by a grid of blocks of porous media and a network of fractures. Dual-porosity and dual-permeability, single-porosity, and discrete fracture models are approaches used in reservoir simulation to model these media, and these approaches have been accepted as suitable for a variety of purposes. In discrete fracture models, for example, the fractures may be represented in n−1 dimensions, with the model being represented overall in n-dimensions. This simplification may provide a beneficial tradeoff between accuracy and efficiency, i.e., conservation of computing resources, as the aperture (flowpath area) of the fractures may be generally small relative to each block of the model. Accordingly, in a three-dimensional block model, the fractures may be each represented as two-dimensional facets, while two-dimensional models may represent fractures as edges. Furthermore, in such two-dimensional models, the edges representing the fractures may be characterized by center coordinates, orientation, hydraulic permeability, and aperture distribution.

Various numerical methods based on discrete fracture models have been used to simulate single and multiphase flow in such modeled fractured media. For example, the finite-volume (FV) method is a mass conservative method that gives correct location of fronts or boundaries between blocks. In this type of method, however, the grid blocks at the fracture intersections may be "removed," that is, the boundaries between fracture grid blocks and the intersection block are neglected and the area of the intersection block, which is small compared to the surrounding blocks, is subsumed into the adjacent blocks. This simplification is used to avoid a need for time steps that are small enough to observe meaningful characteristics at the relatively small intersection block, because such time steps are generally excessively and/or impracticably small for analyzing the larger, surrounding grid blocks.

Thus, instead of actually modeling the behavior of the fluid in the fractured media at the intersection, the behavior of the flow is approximated, typically using the Y-Δ or "star-delta" approximation. However, this approximation is derived from analyses of electrical current flow. While this approximation may be accurate for single-phase incompressible flow situations, it may be unsuitable for complexities that arise in a two-phase flow, compressible flow, etc. situations, which may be common in real-world applications What is needed, then, is an efficient system and method for modeling fracture network flow properties that accurately accounts for two-phase flow.

SUMMARY

Embodiments of the disclosure may provide systems, methods, and computer readable media for modeling a fractured medium. For example, the method may include discretizing a fractured medium into a grid. The grid may include fracture cells and matrix cells. One special case of the fracture cells may be an intersection cell, where two fractures intersect. The intersection cell may be an order of magnitude or more smaller in area than the fracture cells, as it may combine the two smaller dimensions of the elongated fracture cells. Accordingly, to avoid approximating flow characteristics at this intersection and/or to avoid having to set a time step for the simulation at a computationally-expensive, small value, the disclosed method may also include resizing the intersection cell. Such resizing may result in a hybrid, locally non-matching grid, and fluid properties in the non-matching cells may be determined by calculating split flow properties.

The present summary is intended to introduce some of the elements of the subject matter described in greater detail below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings. In the figures:

FIG. 11A illustrates a structured matching grid in a single-porosity model of a domain of a fractured medium, according to an embodiment.

FIG. 11B illustrates a Delaunay, unstructured, hybrid, local non-matching grid of the domain of FIG. 11A, according to an embodiment.

FIG. 12 illustrates a progression of water saturation profiles simulated in the domain of FIGS. 11A and 11B during water injection.

DETAILED DESCRIPTION

Figure 1:
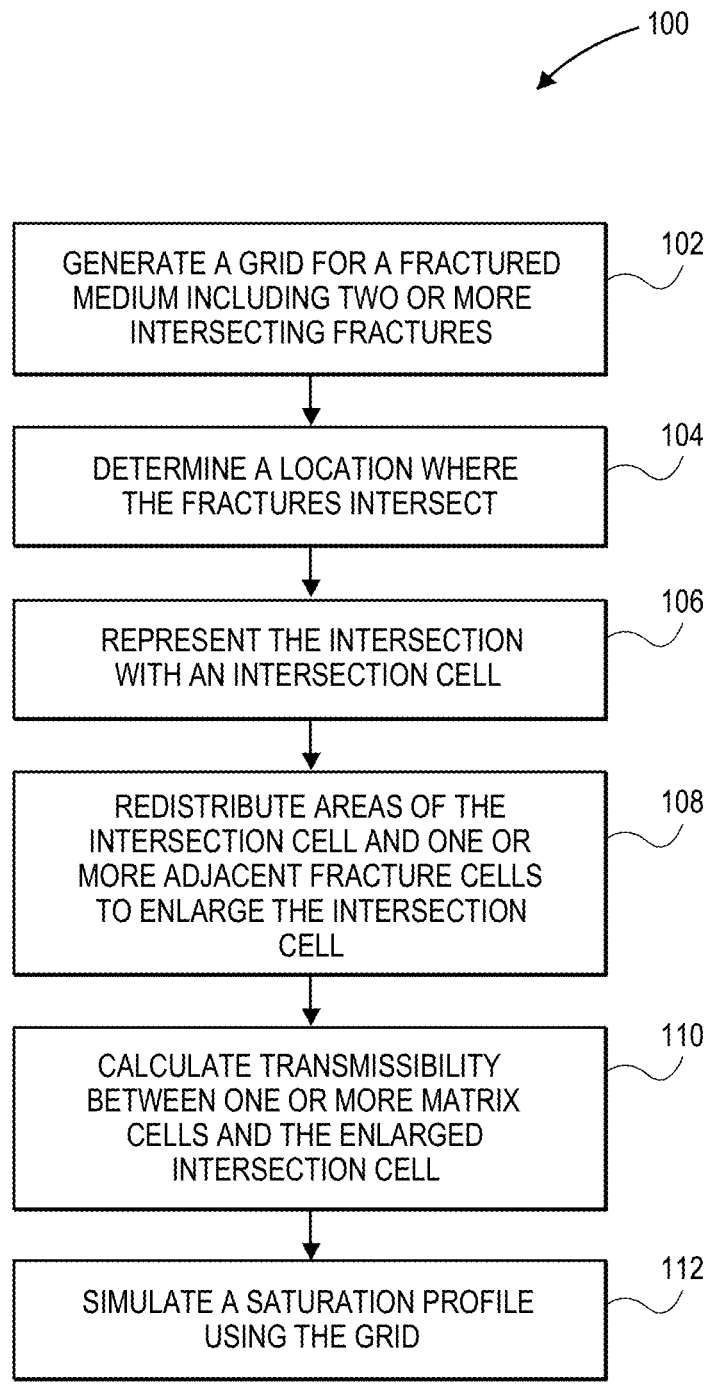
FIG. 1 illustrates a flowchart of a method for modeling a fractured medium, according to an embodiment.

The following detailed description refers to the accompanying drawings. Wherever convenient, the same reference numbers are used in the drawings and the following description to refer to the same or similar parts. While several exemplary embodiments and features of the present disclosure are described herein, modifications, adaptations, and other implementations are possible, without departing from the spirit and scope of the present disclosure. Accordingly, the following detailed description does not limit the present disclosure. Instead, the proper scope of the disclosure is defined by the appended claims.

FIG. 1 illustrates a flowchart of a method 100 for modeling a fractured medium, according to an embodiment. The method 100 may include generating a grid of the fractured medium, at least proximal to fractures thereof, as at 102. The grid may be constructed, at least initially, as a hybrid matching grid. The grid may be characterized as "hybrid," in that it may be a combination of two or more gridding techniques. In at least one embodiment, generating the hybrid grid may include gridding in a "computational space" corresponding to the data and properties contained in each area represented by the cell, while simplifying the grid (as will be described below) in a "grid space." Further, the grid may be characterized as "matching," at least initially, in that each of the cells may line up with each adjacent cell to form a boundary that takes up an entire side extending therebetween.

Figure 2:
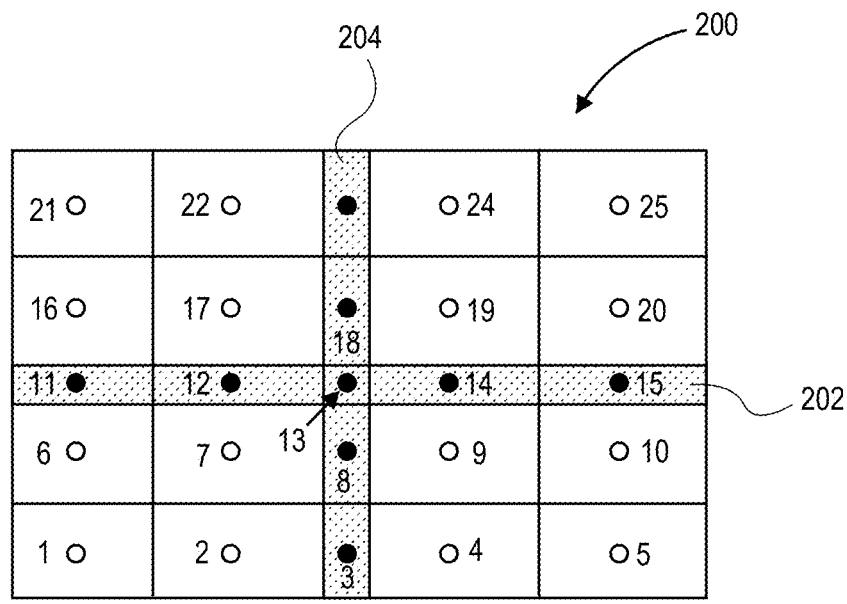
FIG. 2 illustrates a conceptual, schematic view of a grid of a fractured medium in computational space, according to an embodiment.

FIG. 2 illustrates a conceptual schematic view of an example of such a matching gridded fractured medium 200 in computational space. The illustrated fractured medium 200 may be representative of a small portion and/or a simplified conceptual view of an actual fractured medium. Further, the illustrated fractured medium 200 includes two fractures 202, 204, each of which may be represented by or discretized into a plurality of fracture blocks or "cells." More particularly, the fracture 202 may be discretized into fracture cells 11, 12, 14, and 15, while the fracture 204 may be discretized into fracture cells 3, 8, 18, and 23. An intersection cell 13 may represent an intersection of the fractures 202, 204, and may thus be a discretization of both, i.e., may be considered one of the fracture cells of both fractures 202, 204. Further, the medium 200 may be discretized into matrix cells 1, 2, 4, 5, 6, 7, 9, 10, 16, 17, 19, 20, 21, 22, 24, and 25, which may be representative of the geological matrix adjacent to the fractures 202, 204, in which the fractures 202, 204 are defined. As noted above, the grid is "matching" since each set of adjacent cells has one boundary formed therebetween. Further, fluid flow simulation may be at least partially based on flux or transmissibility characteristics of flow across the boundaries between the cells.

Figure 3:
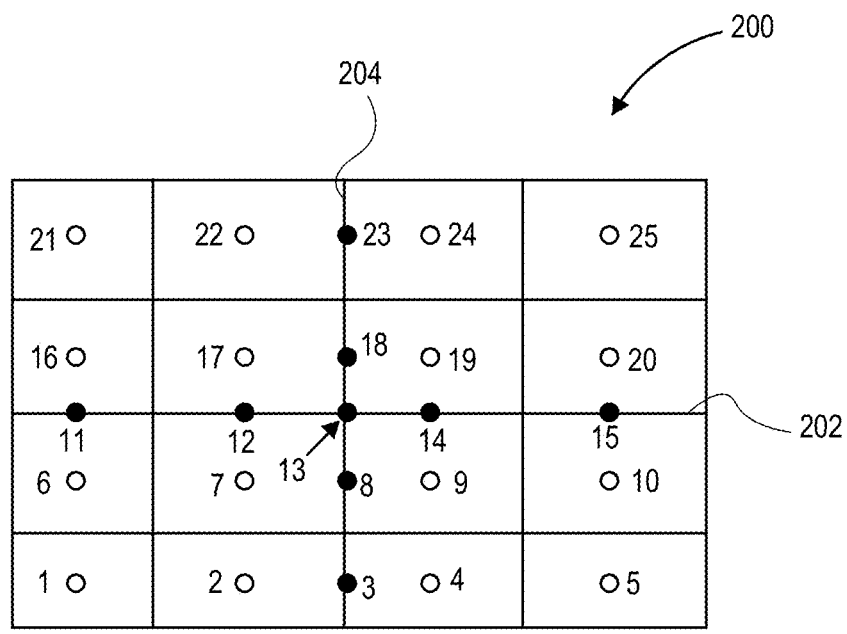
FIG. 3 illustrates a conceptual, schematic view of a grid of a fractured medium in grid space, according to an embodiment.

Such gridding at 102 may also include discretizing the fractured media into grid cells in a grid space. A conceptual representation of the fractured medium 200 shown in the grid space is shown in FIG. 3. The grid space may employ a simplification of the fractures 202, 204, representing them in n−1 dimensions, i.e., in a two-dimensional model, as line segments, as shown. In a three-dimensional model, the fractures may be represented by planes (e.g., normal to the 2D "slice" shown).

Referring again to FIG. 1, the method 100 may employ such grid space to determine a location where the fractures 202, 204 intersect, as at 104. Along with determining the location where the fractures 202, 204 intersect, the method 100 may include representing the intersection with the intersection cell 13, as at 106, which may be centered at the intersection point of the simplified fractures 202, 204 in grid space.

Modeling in the grid space of FIG. 3 may simplify locating the intersection of the fractures 202, 204. For example, determining a location of an intersection of two rectangles (e.g., fractures 202, 204 as shown in FIG. 2) may be computationally more intensive than determining an intersection of two lines (FIG. 3). However, the model may "remember" or store data associated with the grid cells representing the fractures 202, 204 in computational space, such that, once the intersection locations are established in grid space, the model may proceed with simulations that consider transmissibility across boundaries formed by the fracture cells 3, 8, 11, 12, 14, 15, 18, 23.

As can be appreciated particularly in FIG. 2, the intersection cell 13 may be smaller than the fracture cells 11, 12, 14, 15 and/or the fracture cells 3, 8, 18, 23. More particularly, the fracture cells 11, 12, 14, 15 and/or 3, 8, 18, 23 may be elongated in one dimension, for example, based on the relatively small width of the fracture. In some situations, the illustration of the fracture cells 3, 8, 11, 12, 14, 15 18, 23 shown in FIG. 2 may under-represent the extent of the elongation. For example, the larger dimension (e.g., along the horizontal axis for cell 11) of the fracture cells may be on the order of meters or more, while the smaller dimension (e.g., along the vertical axis for cell 11) thereof may be on the order of millimeters or tenths of a millimeter. The intersection cell 13 may be dimensioned, as shown, as a combination of the two smaller dimensions of cells 8 and 18 and thus, in some cases, may be two, three, four, or more orders of magnitude smaller in area than the adjacent cells 8, 12, 18, 14.

While small in size, the behavior of fluid flows at the intersection cell 13 simulate alteration in fluid flow characteristics observed at the juncture of two preferential flowpaths (the fractures 202, 204). Simulating the behavior of fluid flow through such a small space may call for a short time step, i.e., the increment between times that simulation calculations are performed in the model. If the time step is too large, observed behavior of fluid traversing such a small area may not be sufficiently precise or meaningful. On the other hand, a smaller time step may result in increased computational intensity for some or all of the larger cells outside of the intersection cell 13.

Referring again to FIG. 1, to avoid such a situation, while preserving the accuracy of the model, the method 100 may include redistributing a portion of the grid and/or enlarging the intersection cell 13 to form a local non-matching hybrid grid, as at 108. The grid may be "non-matching" in that a single boundary for one cell may be shared with two or more adjacent cells, in contrast to a matching grid, in which one boundary is disposed between each pair of adjacent cells. Further, the non-matching of the cells may be localized at the area proximal the intersection.

Figure 4:
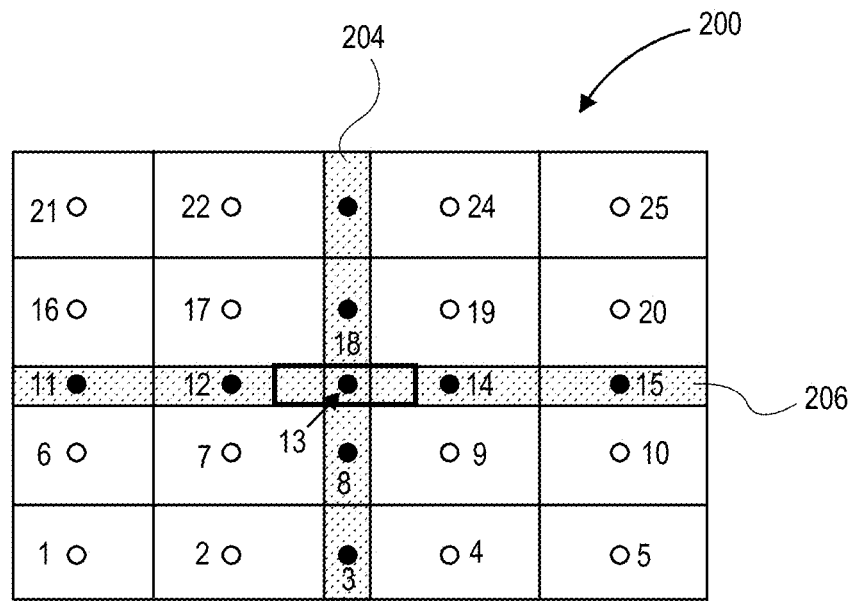
FIG. 4 illustrates another conceptual, schematic view of the grid of FIG. 2, but with the intersection cell having been enlarged, according to an embodiment.

FIG. 4 illustrates a conceptual schematic view of an example of the fractured medium 200, with a locally non-matching grid and an enlarged intersection cell 13. As shown, the boundaries of the intersection cell 13 may be changed as part of redistributing at 108 (FIG. 1). In one embodiment, redistributing at 108 may begin by determining which fracture 202, 204 includes larger cells. It will be appreciated that, although shown as relatively similar sized cells, the fractures 202, 204 may extend for substantially different lengths or otherwise call for cells of different sizes. In some situations, however, the cells of the fractures 202, 204 may have the same size and thus the fractures 202, 204 may be chosen arbitrarily or in view of other factors. Further, in some embodiments, even if the fracture cells of the two fractures 202, 204 are not equal in dimension, the method 100 may include choosing between the fractures 202, 204 according to any other property or even arbitrarily. For this example, the fracture 202 is chosen.

With the fracture 202 chosen, redistributing at 108 may proceed to selecting the two cells 12, 14 of the fracture 202 that are adjacent to the intersection cell 13. Further, in redistributing at 108, the method 100 may then proceed to dividing the area of the three cells 12, 13, 14 such that the area of the intersection cell 13 is enlarged, resulting in a locally non-matching grid. For example, redistributing at 108 may include averaging the larger dimension of the three cells 12, 13, 14 (e.g., as shown, the horizontal dimension) and resetting each of the three cells 12, 13, 14 to the average, thereby effectively taking a portion of the areas of cells 12 and 14 and adding it to the intersection cell 13. In other embodiments, other algorithms for reapportioning the three cells 12, 13, 14 and/or enlarging the intersection cell 13 may be employed. For example, the intersection cell 13 may be increased by incorporating a certain percentage of the adjacent cells 12, 14 and/or the intersection cell 13 may be expanded such that the intersection cell 13 reaches a predetermined size.

Figure 5:
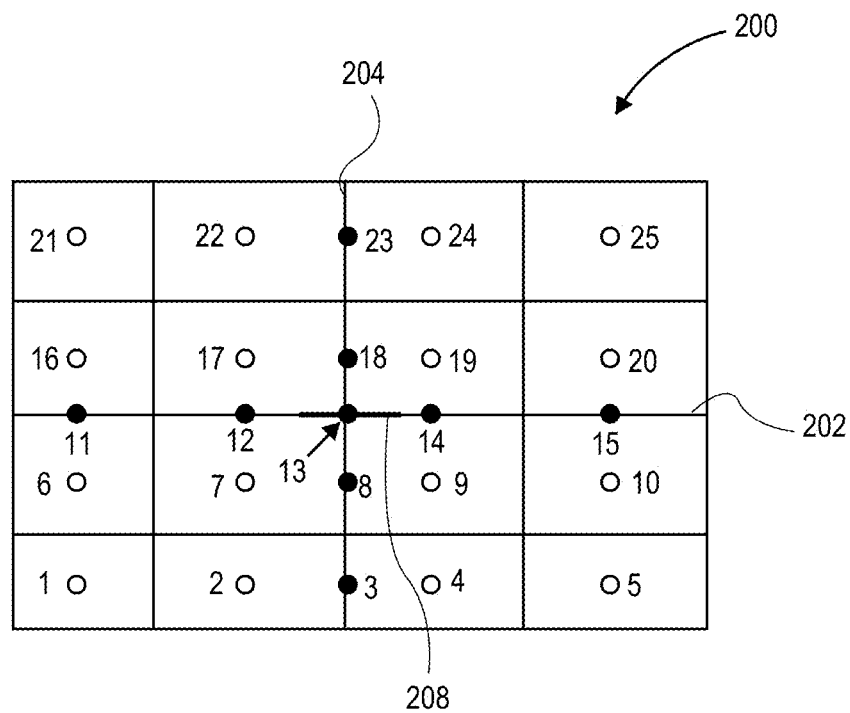
FIG. 5 illustrates another conceptual, schematic view of the grid of FIG. 3, after the intersection cell has been enlarged, according to an embodiment.

As can be appreciated from FIG. 4, the intersection cell 13 is expanded, such that it defines a border with cells 8, 12, 14, and 18, and also with cells 7, 9, 17, and 19; accordingly, the grid may be "non-matching" in the area adjacent to and including the intersection cell 13 (i.e., "locally", that is, a portion of the grid is non-matching where beneficial and, otherwise, is matching). FIG. 5 conceptually illustrates the local, non-matching grid of the fractured medium 200 in the grid space. As shown, a new segment 208 may be present in the grid, which represents the borders created by the expansion of the intersection cell 13. While in other techniques, this intersection cell 13 may be removed and its properties approximated, the embodiments of the present method 100 may include retaining and redistributing the area of the intersection cell 13, at least in the computational space of the grid, such that its properties may be taken directly into account in simulations of the model.

Figure 6:
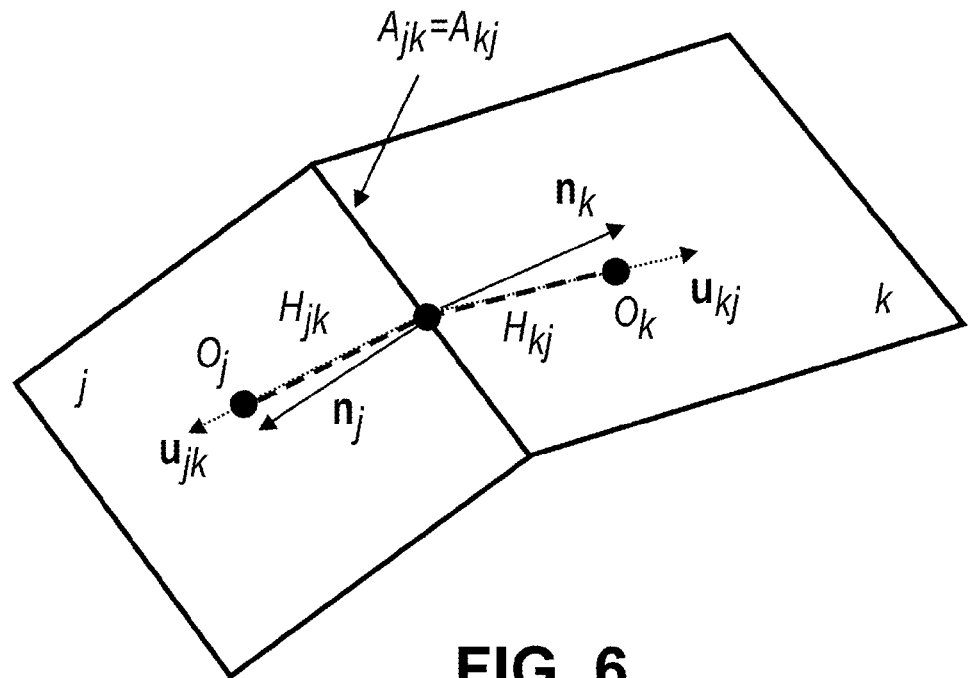
FIG. 6 illustrates a conceptual, schematic view of a calculation of transmissibility between cells in a matching grid, according to an embodiment.
Figure 7:
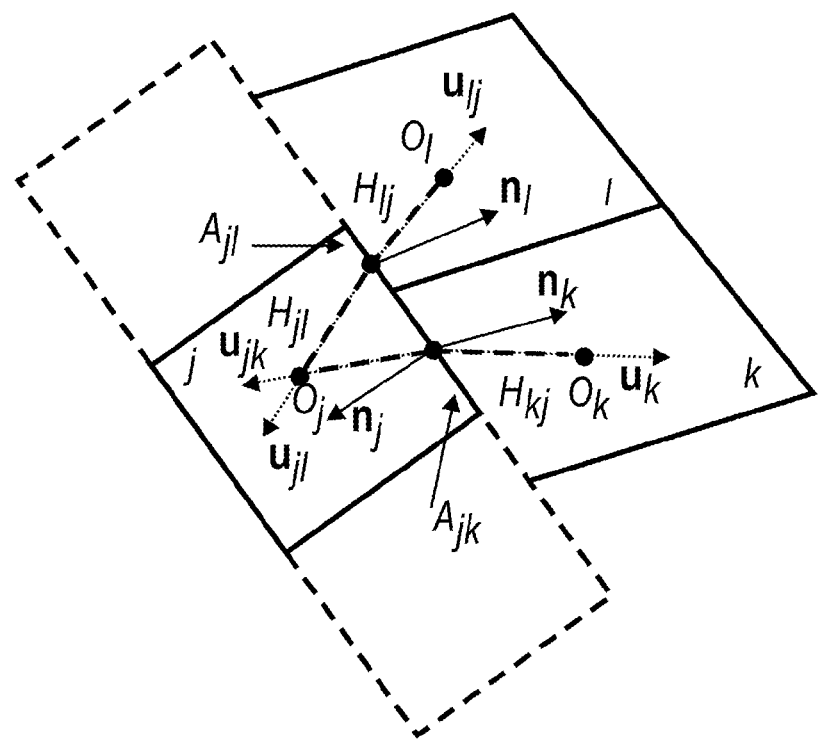
FIG. 7 illustrates a conceptual, schematic view of a calculation of transmissibility between cells in a non-matching grid, according to an embodiment.

Referring again to FIG. 1, the method 100 may proceed to calculating the transmissibility in the non-matching grid portions, e.g., those portions of the matrix cells bordering the enlarged intersection cell 13, as at 110. FIGS. 6 and 7 conceptually illustrate a calculation of transmissibility as at 110 between cells in a matching grid and between cells in a non-matching grid (i.e., a "split" transmissibility), respectively, according to an embodiment. Further, while FIGS. 6 and 7 and the following system of equations illustrate a process employable for simulating the model in accordance with an embodiment of the method 100, it will be appreciated that the particular equations chosen for calculating transmissibility and/or for conducting one more aspects of the simulation are not to be considered limiting on the present disclosure unless expressly stated herein.

The governing equations for mass balance in the reservoir can be written in terms of natural variables, $\{w_i, x_i, y_i, i=1, \ldots, n_c\}$, p, and $\{S_\alpha, \alpha=\text{oil, gas and water}\}$ to avoid conversion to mass and for more flexibility with respect to the level of implicitness. Here, w, x, and y are the component mole fractions in the water, oil, and gas phases, respectively. The variable $n_c$ denotes the number of hydrocarbon components, p is the phase pressure, and S is the phase saturation. Conservation of mass, Darcy's law, thermodynamic equilibrium between phases, a saturation constraint, and a mole fraction constraint may be the governing equations of the simulation. Applying the divergence theorem, the component i material balance equation for a general control volume j may be:

$$\frac{\partial M_i^j}{\partial t} + \sum_{k=1}^{n_j} F_i^{jk} + \sum_s^{n_s} Q_i^{js} = 0. \quad (1)$$

In the left side of equation (1), the first term denotes the rate of change of the number of moles of component i in control volume j, the second term is the sum of intercell flows of component i into control volume j from the $n_j$ connected control volumes k, and the third term represents the sum of flows of component i into control volume j from external $n_s$ sources or sinks, s. For each control volume j, equation (1) accounts for fluxes coming from all control volumes sharing with j a part or a complete facet. Numerically, the number of these control volumes may vary with respect to the grid shapes. For example, $n_{17}$ is equal to 4 for the structured matching grid shown in and described above with respect to FIG. 3, and $n_{17}$ is 5 for the local non-matching grid method shown in and described above with reference to FIG. 5.

Several other time-discretization schemes may also be supported, including implicit pressure and saturation (IMPSAT) and adaptive implicit (AIM), which may provide numerical stability at reduced computational cost. The implicit pressure and saturation approaches and an adaptive implicit approach are based predominantly on implicit pressure and saturation, in which the time-step selection is made according to one or more stable time-step criteria. The split of primary and secondary variables may be configurable at run time according to the phases present and the state of the fluid model. In the present example, an adaptive implicit method suitable for grids with large contrasts in the element control volume sizes (i.e., fracture and matrix grid blocks) is employed; however, others are contemplated for use herein.

Furthermore, in one example, a cell-based finite value (FV) method may be implemented. A graph of connections may be supplied to describe the connectivity between the control volumes. This serves to approximate the flow rates coming into a control volume from connecting control volumes (equation (1)). Moreover, a local mortar finite value method may be employed to account for the hybrid local non-matching grid. At least as described above, the graph of connections may be locally modified to account for the new connections imposed by the changes made over the small control volume at fracture intersections.

The finite value method can be derived by the approximation of the potential using a piecewise constant test function on control volumes across the interfaces from a set of neighboring control volume pressures. The two-point flux approximation (TPFA) method may be used to approximate the flux through interfaces, as follows. The flow rate of component i at time τ between two connected control volumes j and k can be approximated using a standard two-point flux approximation method, as:

$$F_i^{jk,\tau} \approx T_{jk} \sum_\alpha (\lambda_\alpha^\tau b_\alpha^\tau X_\alpha^\tau)^* (\Phi_\alpha^{j,\tau} - \Phi_\alpha^{k,\tau}). \qquad (2)$$

In equation (2), $T_{jk}$ denotes the transmissibility constant between control volumes j and k. The variables $\lambda$, b, and $\Phi$ are the phase mobility, molar density, and potential, respectively. The phase potential includes the phase pressure and the capillary pressure and gravity forces. The superscript '*' denotes the upstream direction for each phase and for each connection. The variable $\chi$ is the component mole fraction in the related phase.

Determining the transmissibility in the non-matching portions of the grid, i.e., between the non-matching grid control volumes or "cells" may include generalizing the transmissibility between any two control volumes j and k from the transmissibility calculation for corner-point systems, which can be written as:

$$T_{jk} = \frac{A_{c,jk} c_{jk} c_{kj}}{c_{jk} + c_{kj}}, \qquad (3)$$

where $$c_{jk} = \frac{A_{jk} K_j}{H_{jk}} n_j \cdot u_{jk}. \qquad (4)$$

In equations (3) and (4), $A_{c,jk}$ is the contact area between control volumes j and k; $A_{jk}$ is the complete area of each neighbor; $K_j$ is the control volume j permeability; $H_{jk}$ is the distance between the centroid of the control volume j and the centroid of the interface between the control volumes j and k; $n_j$ is the unit normal vector to the interface inside block j; and $u_{jk}$ is the unit vector along the line joining $O_j$ the block j center and centroid of the interface. For adjacent control volumes in a fully-conformed mesh, the interface areas $A_{jk}$, $A_{jk}$ and $A_{c,jk}$ may be equal.

In equation 4, $A_{jk}$ is the area of the interface between control volumes j and k; $K_j$ is the control volume j permeability; $H_{jk}$ is the distance between the centroid of the control volume j and the centroid of the interface between the control volumes j and k; $n_j$ is the unit normal vector to the interface inside block j; and $u_{jk}$ is the unit vector along the line joining $O_j$ the block j center and centroid of the interface.

In non-matching grid control volumes, one interface can be partially shared between more than two control volumes, as shown in FIG. 7. A part of the block j side belongs to block k, and another part belongs to block 1. To generalize the transmissibility expression in equation 3, the variables have been bi-indexed to localize the interface between any two control volumes. Thus, this formula is also valid for the hybrid, local non-matching grid method 100, according to one or more embodiments disclosed. As such, there may be no need to introduce any other transmissibility calculation formulas.

With the transmissibility calculated, as at 110, a simulator of any suitable type may be employed to simulate conditions in the model, as at 112. The simulator may proceed using grid space, with the fractures simplified into n−1 dimensions. However, the simulator may include transmissibility calculations across the borders of the intersection cell 13, as conceptually indicated as line segment 208 in FIG. 5. Thus, the method 100 may include allowing the simulator to flexibly increase the time step, as the smaller fracture volumes are removed, but retain precision by characterizing transmissibility across the intersection of the fractures 202, 204.

Figure 8:
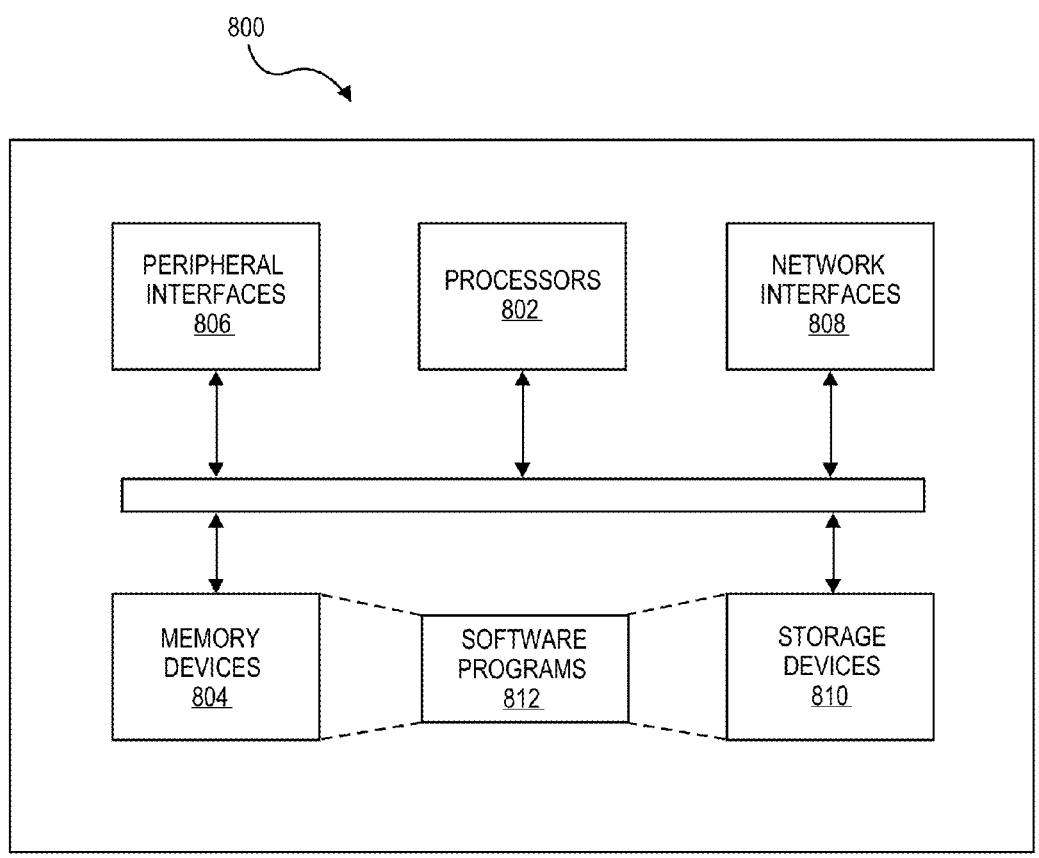
FIG. 8 illustrates a schematic view of a processor system, according to an embodiment.

Embodiments of the disclosure may also include one or more systems for implementing one or more embodiments of the method 100. FIG. 8 illustrates a schematic view of such a processor system 800, according to an embodiment. The processor system 800 may include one or more processors 802 of varying core (including multiple core) configurations and clock frequencies. The one or more processors 802 may be operable to execute instructions, apply logic, etc. It will be appreciated that these functions may be provided by multiple processors or multiple cores on a single chip operating in parallel and/or communicably linked together.

The processor system 800 may also include a memory system, which may be or include one or more memory devices and/or computer-readable media 804 of varying physical dimensions, accessibility, storage capacities, etc. such as flash drives, hard drives, disks, random access memory, etc., for storing data, such as images, files, and program instructions for execution by the processor 802. In an embodiment, the computer-readable media 804 may store instructions that, when executed by the processor 802, are configured to cause the processor system 800 to perform operations. For example, execution of such instructions may cause the processor system 800 to implement one or more portions and/or embodiments of the method 100 described above.

The processor system 800 may also include one or more network interfaces 808. The network interfaces 808 may include any hardware, applications, and/or other software. Accordingly, the network interfaces 808 may include Ethernet adapters, wireless transceivers, PCI interfaces, and/or serial network components, for communicating over wired or wireless media using protocols, such as Ethernet, wireless Ethernet, etc.

The processor system 800 may further include one or more peripheral interfaces 806, for communication with a display screen, projector, keyboards, mice, touchpads, sensors, other types of input and/or output peripherals, and/or the like. In some implementations, the components of processor system 800 need not be enclosed within a single enclosure or even located in close proximity to one another, but in other implementations, the components and/or others may be provided in a single enclosure.

The memory device 804 may be physically or logically arranged or configured to store data on one or more storage devices 810. The storage device 810 may include one or more file systems or databases in any suitable format. The storage device 810 may also include one or more software programs 812, which may contain interpretable or executable instructions for performing one or more of the disclosed processes. When requested by the processor 802, one or more of the software programs 812, or a portion thereof, may be loaded from the storage devices 810 to the memory devices 804 for execution by the processor 802.

Those skilled in the art will appreciate that the above-described componentry is merely one example of a hardware configuration, as the processor system 800 may include any type of hardware components, including any necessary accompanying firmware or software, for performing the disclosed implementations. The processor system 800 may also be implemented in part or in whole by electronic circuit components or processors, such as application-specific integrated circuits (ASICs) or field-programmable gate arrays (FPGAs).

Accordingly, it will be appreciated from the foregoing that systems and methods for modeling fractured, porous media are provided. Such systems and methods may obviate a lack of precision that is often associated with removing an intersection cell and approximating the transmissibility with respect thereto. Such approximations may suffer from drawbacks, such as imprecise application to two-phase flow, gravity, capillary pressures, and/or the like. Furthermore, the presently-disclosed systems and methods may allow for a larger time step that would be allowed by a matching grid that does not approximate the behavior at the intersections, thereby reducing computational time for simulating the model.

EXAMPLES

An understanding of the systems and methods described above may be furthered by reference to the following examples.

TABLE 1

Relevant data for Examples 1 and 2.

| | |
|---|---|
| Domain Dimensions | 1 m × 1 m |
| Matrix | $\phi_{ma} = 0.2$, $K_{ma} = 1$ md. |
| Fracture | $\phi_f = 1$, $K_f = 10^5$ md, e = 0.1 mm |
| Fluid | $\mu_o = 0.45$ cp, $\mu_w = 1$ cp |
| Injection Rate | 0.01 PV/D |
| Grid | Example 1 |
| | Structured MG: 1,600-square control volumes |
| | Unstructured HLNMG: 2,711 2D triangle and 1D fracture control volumes |
| | Example 2 |
| | Structured MG: 8,000-cube control |
| | Unstructured HLNMG: 10,940 3D prism and 2D fracture control volumes |

Example 1

2D Fractured Porous Medium

Figure 9:
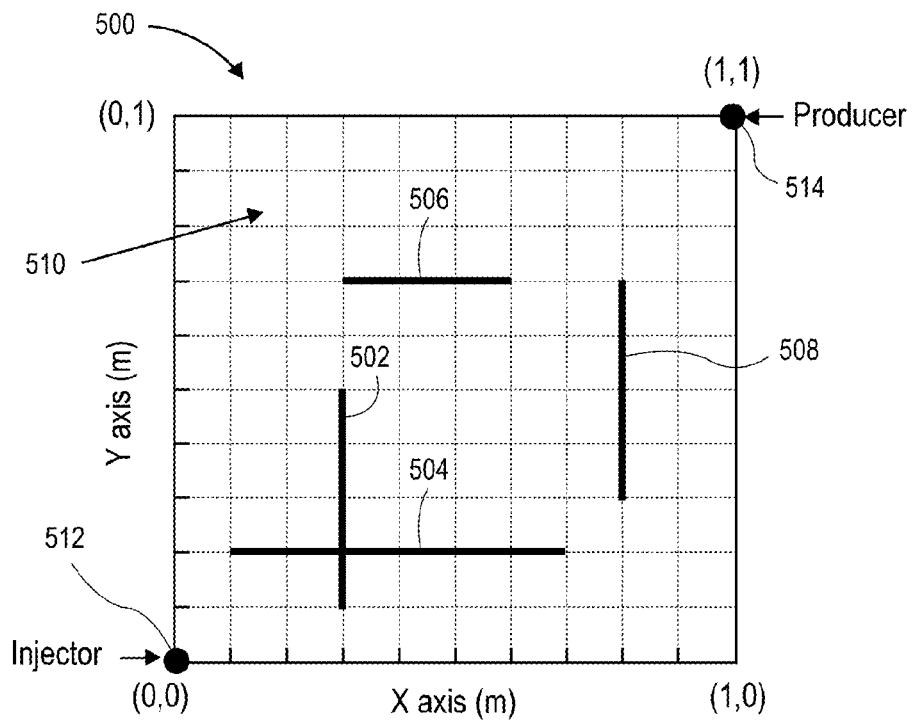
FIG. 9 illustrates a schematic view of a simplified rectangular domain of a fractured medium, according to an embodiment.

FIG. 9 illustrates a schematic view of a simplified rectangular domain 500 of a fractured medium, according to an embodiment. The domain 500 may include fractures 502, 504, 506, 508. The fractures 502, 504 may be connecting, while the fractures 506, 508 may be isolated, i.e., not connecting with other fractures. Further, the domain 500 may include a porous media 510 in which the fractures 502-508 are defined. The rock and fluid properties are shown in Table 1.

Figure 10:
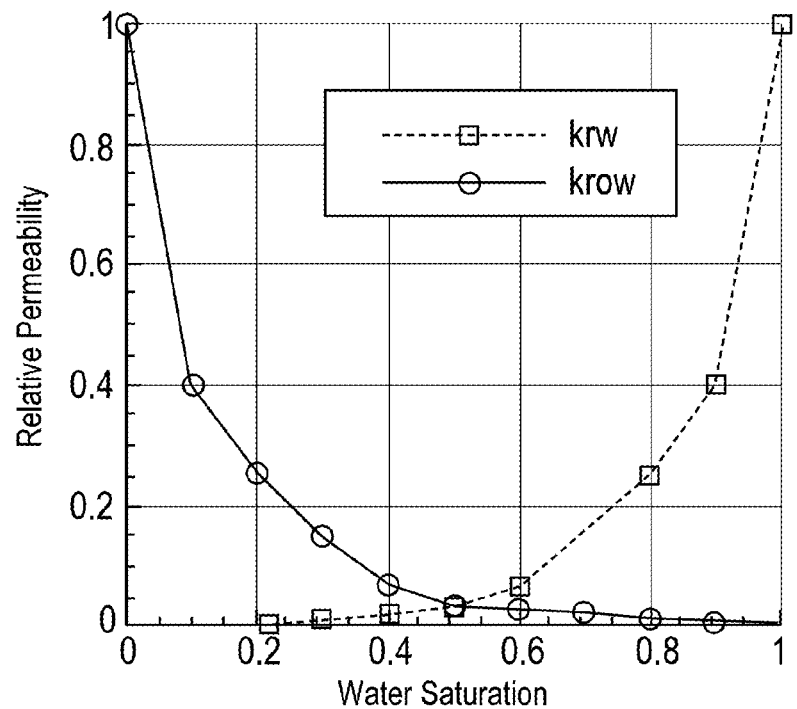
FIG. 10 illustrates examples of linear relative permeability functions for modeling the domain, according to an embodiment.

FIG. 10 illustrates examples of linear relative permeability functions used for modeling the domain 500. In this plot, the line labeled as $k_{rw}$ illustrates water relative permeability and $k_{row}$ illustrates oil relative permeability. As can be appreciated, in the illustrated embodiment, water relative permeability increases with increasing water saturation, while oil relative permeability decreases with respect thereto.

Referring again to FIG. 9, water is injected at the lower left corner 512 (i.e., at an injector well or "injector") of the domain 500 to produce oil at the opposite corner 514 (i.e., a producer well or "producer") thereof. In this example, the porosity and the permeability of the matrix are 0.2 and 1 md, respectively. The thickness of the fractures is 0.1 mm, and the permeability is $10^5$ md. A bottom hole pressure (BHP) is imposed at the producer 514, and a 0.01 PV/D of water is injected at the injector 512. Capillary pressures are neglected in this example.

FIG. 11A illustrates a Cartesian grid, i.e., a structured matching grid (MG) single-porosity model of the domain 500 with the fractures 502-508 and the porous medium 510. FIG. 11B illustrates a Delaunay unstructured hybrid, local non-matching grid (HLNMG) of the domain 500. The unstructured grid of FIG. 11B may be generated using G23FM, a tool for meshing complex geological media, or another tool, and, in this example, contains 2,700 triangular control volumes. In comparison, the structured grid of FIG. 11A may include 1,600 structured matching grid control volumes.

FIG. 12 illustrates a progression of water saturation profiles simulated in the domain 500 after 1 day, 11 days, 25 days, and 60 days of water injection. More particularly, profiles A-D illustrate the water saturation profiles using the structured matching grid single-porosity model, while profiles E-H illustrated the water saturation profiles using the hybrid, local non-matching grid. As can be appreciated from the illustrated profiles, the results of using the hybrid, local-non-matching grid (e.g., implementing one or more embodiments of the method 100) are close to the reference solution obtained with a finely structured matching grid shown in FIG. 11A.

Figure 13A:
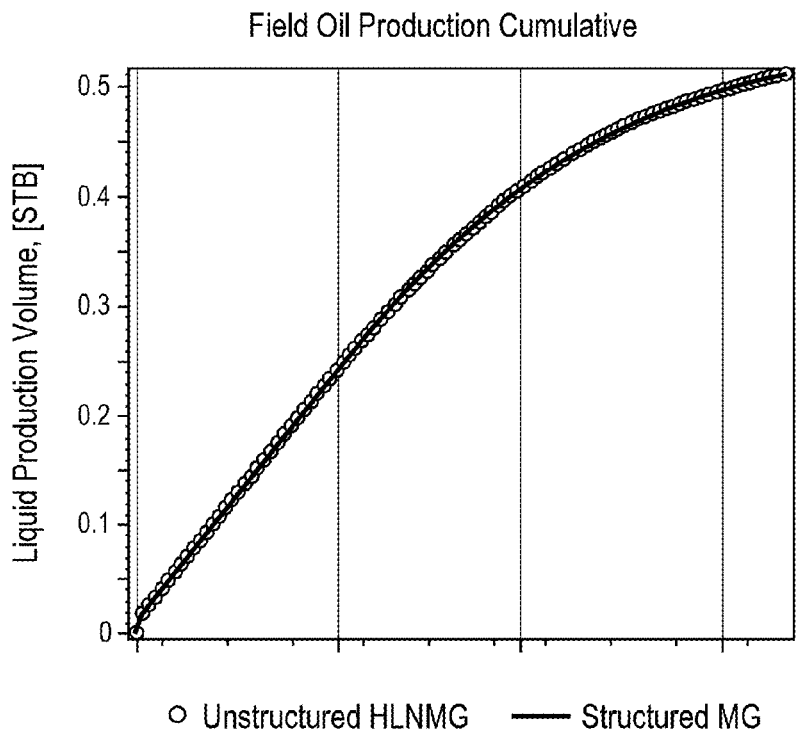
FIG. 13A illustrates a plot showing a comparison of simulation results for cumulative field oil production in an unstructured, hybrid, local non-matching grid versus in a structured matching grid, according to an embodiment.
Figure 13B:
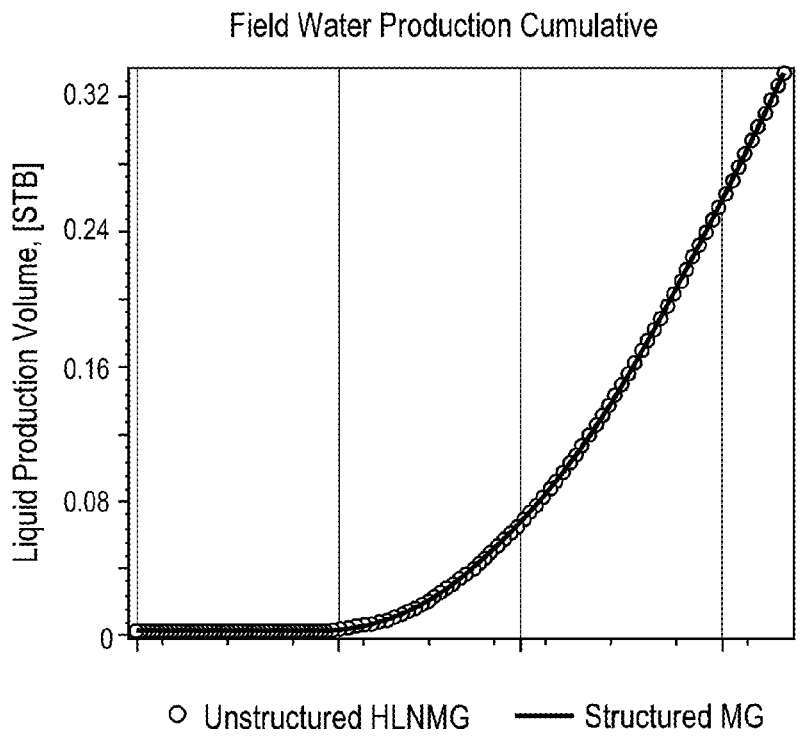
FIG. 13B illustrates a plot showing a comparison of simulation results for cumulative field water production in an unstructured, hybrid, local non-matching grid versus in a structured matching grid, according to an embodiment.

Furthermore, as shown in FIGS. 13A and 13B, the cumulative oil and water produced show close agreement between the finely structured matching grid (MG) and the unstructured hybrid, local non-matching grid (HLNMG) methods. Computationally, however, the hybrid, local non-matching method (i.e., an embodiment of the method 100) was run in less time than the matching grid method. The improved computational efficiency may be due at least to the removal of the intermediate control volume, the sparseness of the linear system matrix, and better conditioning of the overall linear system.

Example 2

3D Fractured Porous Medium

Figure 14:
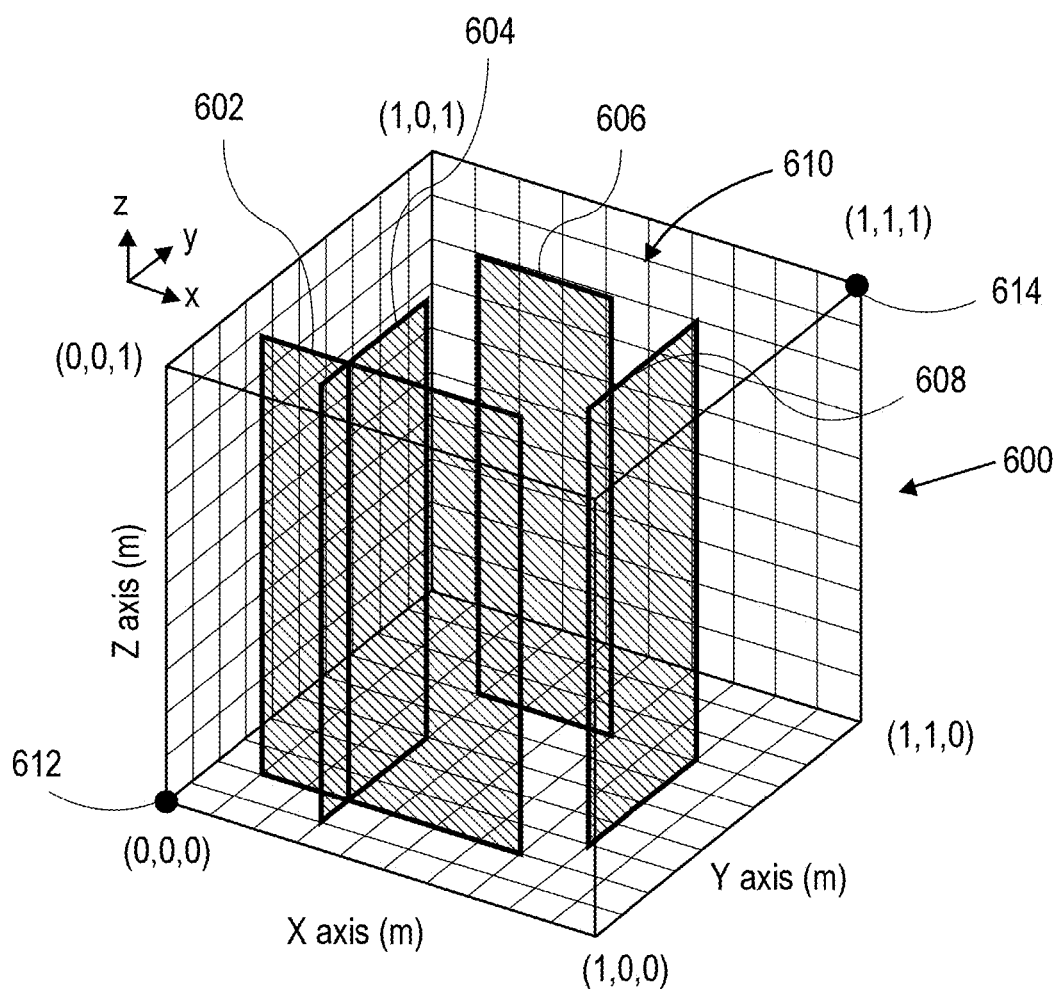
FIG. 14 illustrates a three dimensional rectangular-prism domain, according to an embodiment.

FIG. 14 illustrates a three dimensional rectangular-prism domain 600, according to an embodiment, which is selected having the dimensions of one meter by one meter by one meter (1 m×1 m×1 m). The domain 600 includes fractures 602, 604, 606, 608 defined in a geologic matrix 610. In the three-dimensional model, the fractures 602-608 are simplified as planes (n−1 dimensions as compared to the three-dimensional domain 600). The fractures 602 and 604 may be connecting, while the fractures 606, 608 may be isolated. Further, the domain 600 includes an injection point 612 located at the bottom left and a production point 614, from which the oil may be extracted.

Figure 15:
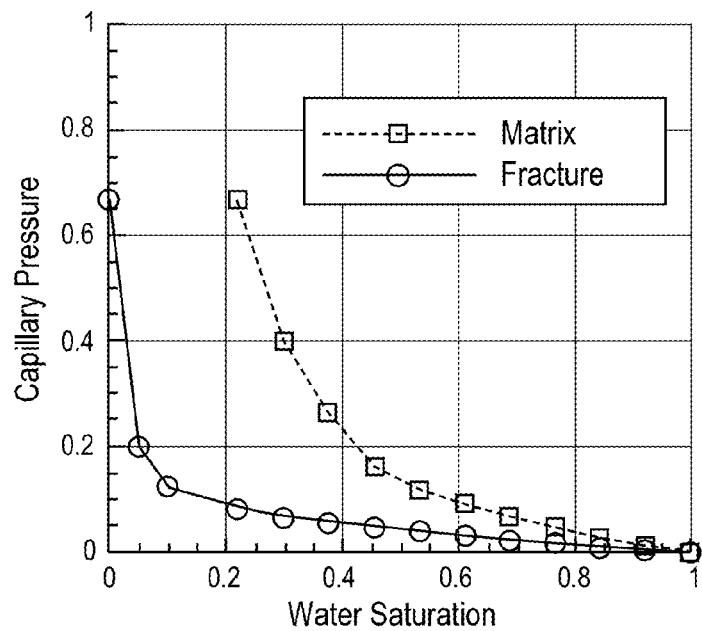
FIG. 15 illustrates two capillary pressure curves used for the matrix and the fractures of FIG. 14, according to an embodiment.

Initially, the domain 600 is considered to be saturated with oil. The fluid, matrix 610, and fractures 602-608 properties are shown in Table 2, with the saturation functions being those shown in and described above with reference to FIG. 12. Water is injected at a rate of 0.01 PV/D at the injection point 612 (0, 0, 0) to produce oil from the production point 614 (1, 1, 1). A bottom hole pressure is imposed at the production point 614. Two capillary pressure curves are used for the matrix 602 and the fractures 602-608, as shown in FIG. 15.

Figure 16:
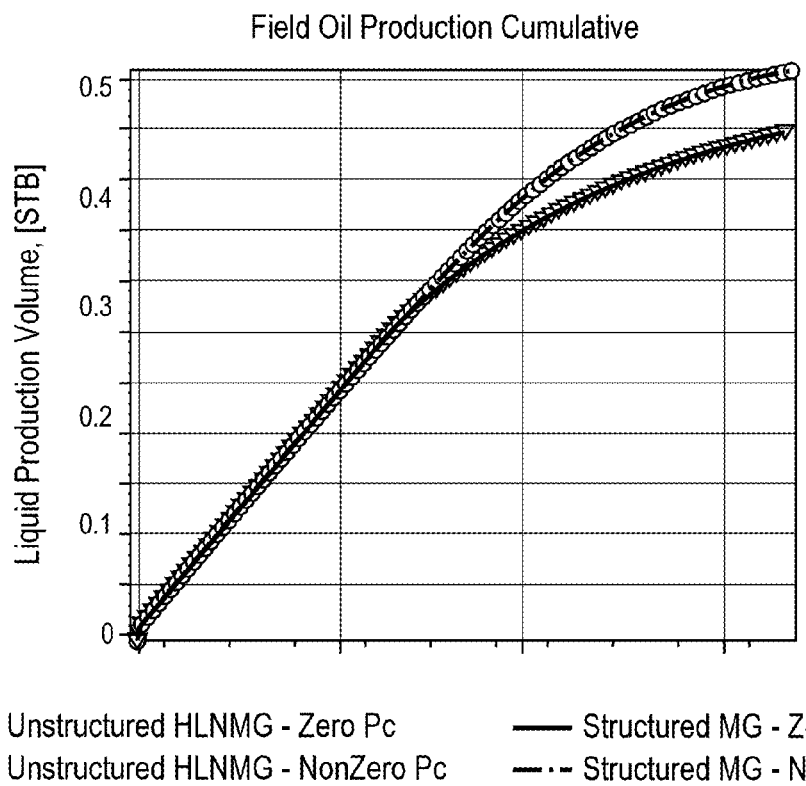
FIGS. 16 and 17 illustrate plots of the results of simulating flow using the grids, comparing the matching grid technique with the hybrid, local non-matching grid method for cumulative field oil production and cumulative field water production, respectively.
Figure 17:
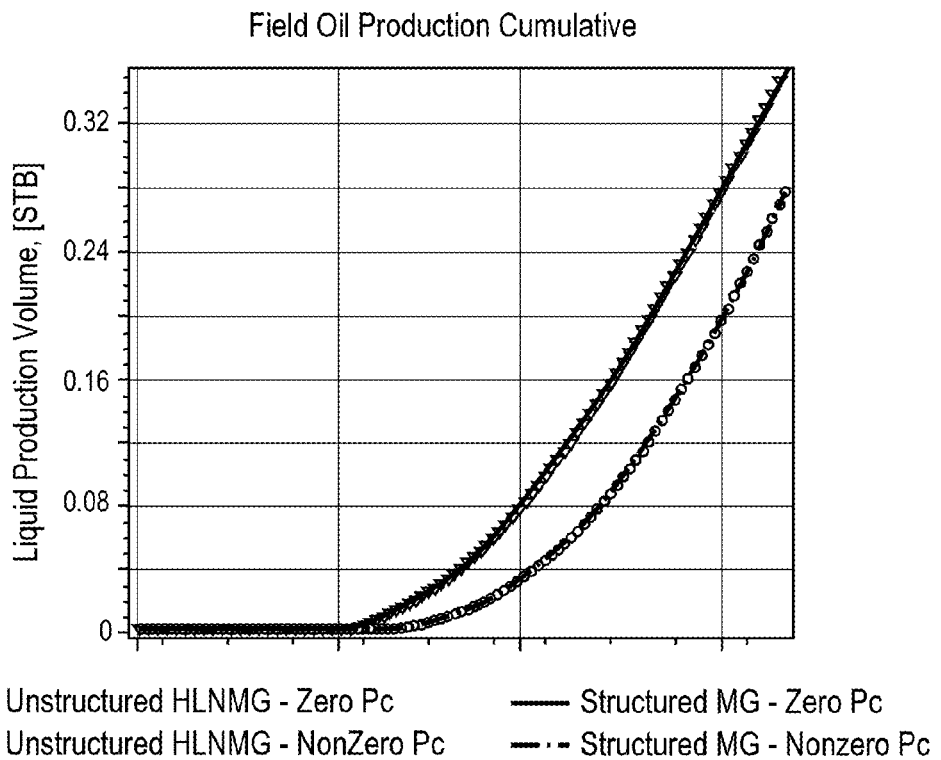

A reservoir simulator, such as SCHLUMBERGER's ECLIPSE or INTERSECT software, may also be used on an unstructured hybrid, local non-matching grid with 10,940 prisms (i.e., consistent with an experimental embodiment of the method 100) and 8,000 cubes in a finely structured matching grid. The remaining simulation parameters may be repeated from Example 1. FIGS. 16 and 17 illustrate plots of the results, comparing the matching grid technique with the hybrid, local non-matching grid method for cumulative field oil production and cumulative field water production, respectively. As can be appreciated, these figures show similar cumulative oil and water production profiles for both methods. Non-zero capillary pressures may delay the breakthrough (FIG. 17), and improve the recovery (FIG. 16), which is consistent with the results produced using both gridding techniques.

Figure 18:
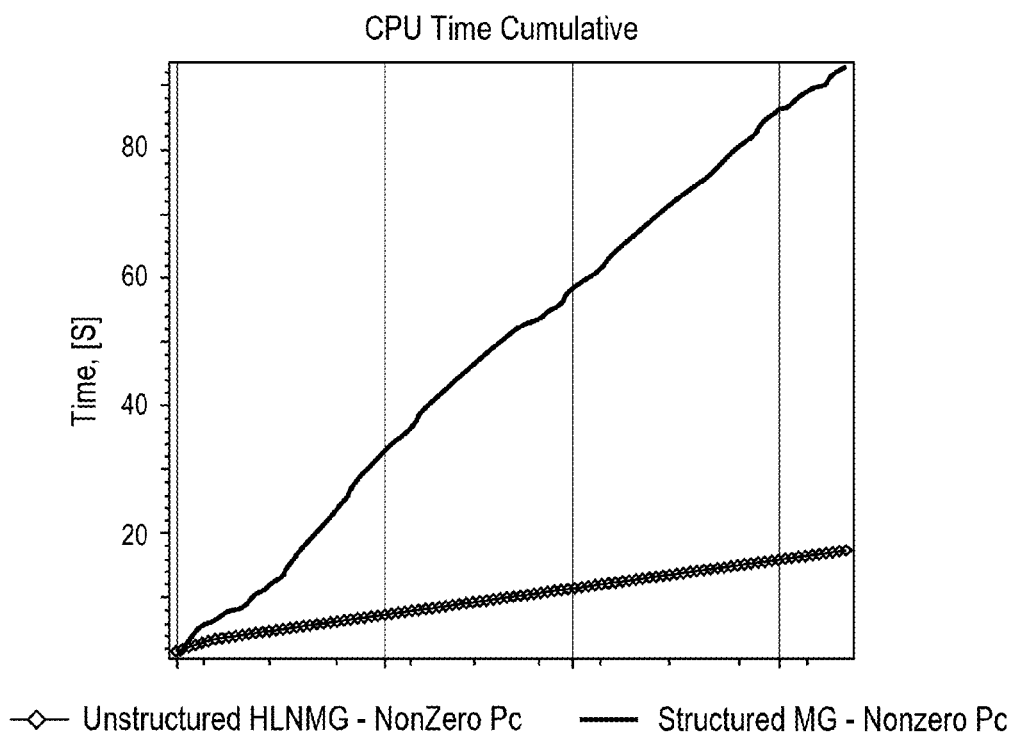
FIG. 18 illustrates a plot of comparing computational time for the two gridding techniques, according to an embodiment.

Although the results of the two processes may be comparable, the experimental embodiment of the method 100 exhibits a reduction in computing time over the matching grid. FIG. 18 illustrates a plot of such reduced computation time. Despite the greater number of unstructured control volumes, the simulator is about five times faster on an unstructured hybrid, local non-matching grid than on a structured matching grid, as shown in FIG. 18. Such improved results may be driven by at least two elements. First, since the gridding method is hybrid, the method 100 removes the fracture volumes of the connecting fractures, as described above, which provides more flexibility to the simulator to increase the time step. Second, the linear system may be sparser and better conditioned.

In a comparison of the time steps on both grids, FIG. 18 evidences small time steps for the structured matching grid, while a simulator is able to reach the maximum time step allowed (1 day) on the unstructured hybrid, local non-matching grid. The results of this example validate and demonstrate the performance of the proposed method in three dimensions.

In addition to these examples, the proposed example methods have been tested for a variety of other flow problems, including real-world, multiple fracture, large domain models. The examples have demonstrated the powerful features of the method 100, including an agreement obtained with a reference solution, consistent with the examples 1 and 2 presented above.

The foregoing description of the present disclosure, along with its associated embodiments and examples, has been presented for purposes of illustration only. It is not exhaustive and does not limit the present disclosure to the precise form disclosed. Those skilled in the art will appreciate from the foregoing description that modifications and variations are possible in light of the above teachings or may be acquired from practicing the disclosed embodiments.

For example, the same techniques described herein with reference to the processor system 800 may be used to execute programs according to instructions received from another program or from another processor system altogether. Similarly, commands may be received, executed, and their output returned entirely within the processing and/or memory of the processor system 800. Accordingly, neither a visual interface command terminal nor any terminal at all is strictly necessary for performing the described embodiments.

Likewise, the steps described need not be performed in the same sequence discussed or with the same degree of separation. Various steps may be omitted, repeated, combined, or divided, as necessary to achieve the same or similar objectives or enhancements. Accordingly, the present disclosure is not limited to the above-described embodiments, but instead is defined by the appended claims in light of their full scope of equivalents. Further, in the above description and in the below claims, unless specified otherwise, the term "execute" and its variants are to be interpreted as pertaining to any operation of program code or instructions on a device, whether compiled, interpreted, or run using other techniques.

What is claimed is:

1. A method for modeling a fractured medium, comprising:
generating, using a processor, a grid for the fractured medium, the fractured medium defining a first fracture and a second fracture, wherein the first fracture and the second fracture are each represented by fracture cells in the grid;
determining a location where the first and second fractures intersect, wherein the location is at least partially represented by an intersection cell of the fracture cells of the grid;
redistributing areas of the intersection cell and at least one other fracture cell, such that a size of the intersection cell is increased;
determining transmissibility in non-matching portions of the grid, comprising generalizing transmissibility between any two control volumes j and k from a transmissibility calculation for corner-point systems, using the following formulation:

$$T_{jk} = \frac{A_{c,jk} c_{jk} c_{kj}}{c_{jk} + c_{kj}}, \text{ where}$$

$$c_{jk} = \frac{A_{jk} K_j}{H_{jk}} n_j \cdot u_{jk},$$

where $A_{c,jk}$ is the contact area between control volumes j and k, $A_{jk}$ is a complete area of each neighbor, $K_j$ is the control volume j permeability, $H_{jk}$ is a distance between a centroid of the control volume j and a centroid of the interface between the control volumes j and k, $n_j$ is a unit normal vector to the interface inside block j, $u_{jk}$ is the unit vector along the line joining $O_j$ the block j center and centroid of the interface, and $A_{jk}$ is the area of the interface between control volumes j and k, wherein for adjacent control volumes in a fully-conformed mesh, the interface areas Ajk, Ajk and Ac,jk may be equal; and
simulating fluid flow based on the transmissibility.

2. The method of claim 1, wherein determining the location comprises:
representing the fractured medium in a grid space and in a computation space, wherein the first and second fractures are represented in n dimensions in the computational space and in n−1 dimensions in the grid space and the fractured medium is represented in n dimensions in both the grid space and the computational space.

3. The method of claim 1, wherein redistributing comprises:
determining that the fracture cells representing the first fracture are larger than the fracture cells representing the second fracture; and
selecting at least one of the fracture cells representing the first fracture as the at least one other fracture cell for redistribution with the intersection cell.

4. The method of claim 1, wherein redistributing comprises:
selecting a first cell of the fracture cells representing the first fracture and a second cell of the fracture cells representing the first fracture, wherein the first and second cells are positioned adjacent to the intersection cell;
calculating an average for a dimension of the first cell, the second cell, and the intersection cell; and
redistributing an area of the first cell, an area of the second cell, and the area of the intersection cell such that the dimension for each of the first, second, and intersection cells equals the average.

5. The method of claim 4, wherein redistributing causes the grid to be a local, non-matching grid, such that the intersection cell forms a border with each of the first cell, the second cell, and at least one matrix cell of the grid, wherein the at least one matrix cell also forms a border with the first cell.

6. The method of claim 5, further comprising determining a split transmissibility between the at least one matrix cell, the first cell, and the intersection cell.

7. The method of claim 5, further comprising determining a transmissibility between the at least one matrix cell and another matrix cell via the intersection cell.

8. The method of claim 1, further comprising:
simulating a flow of fluid through the fractured medium, including through the location where the first and second fractures intersect; and
displaying a result of the simulation.

9. A system for modeling a fractured medium, comprising: one or more processors; and one or more non-transitory computer readable media containing instructions that, when executed by at least one of the one or more processors, are configured to cause the system to perform operations, the operations comprising:
generating a grid for the fractured medium, the fractured medium defining a first fracture and a second fracture, wherein the first fracture and the second fracture are each represented by fracture cells in the grid;
determining a location where the first and second fractures intersect, wherein the location is at least partially represented by an intersection cell of the fracture cells of the grid;
redistributing areas of the intersection cell and at least one other fracture cell, such that a size of the intersection cell is increased;
determining transmissibility in the non-matching portions of the grid, comprising generalizing transmissibility between any two control volumes j and k from a transmissibility calculation for corner-point systems, using the following formulation:

$$T_{jk} = \frac{A_{c,jk} c_{jk} c_{kj}}{c_{jk} + c_{kj}}, \text{ where}$$

$$c_{jk} = \frac{A_{jk} K_j}{H_{jk}} n_j \cdot u_{jk},$$

where $A_{c,jk}$ is the contact area between control volumes j and k, $A_{jk}$ is a complete area of each neighbor, $K_j$ is the control volume j permeability, H is a distance between a centroid of the control volume j and a centroid of the interface between the control volumes j and k, $n_j$ is a unit normal vector to the interface inside block j, $u_{jk}$ is the unit vector along the line joining $O_j$ the block j center and centroid of the interface, and $A_{jk}$ is the area of the interface between control volumes j and k, wherein for adjacent control volumes in a fully-conformed mesh, the interface areas Ajk, Ajk and Ac,jk are equal; and
simulating fluid flow based on the transmissibility.

10. The system of claim 9, wherein determining the location comprises:
representing the fractured medium in a grid space and in a computation space, wherein the first and second fractures are represented in n dimensions in the computational space and in n−1 dimensions in the grid space, and the fractured medium is represented in n dimensions in both the grid space and the computational space.

11. The system of claim 9, wherein redistributing comprises:
determining that the fracture cells representing the first fracture are larger than the fracture cells representing the second fracture; and
selecting at least one of the fracture cells representing the first fracture as the at least one other fracture cell for redistribution with the intersection cell.

12. The system of claim 9, wherein redistributing comprises:
selecting a first cell of the fracture cells representing the first fracture and a second cell of the fracture cells representing the first fracture, wherein the first and second cells are positioned adjacent to the intersection cell;
calculating an average for a dimension of the first cell, the second cell, and the intersection cell; and
redistributing an area of the first cell, an area of the second cell, and the area of the intersection cell, such that the dimension for each of the first, second, and intersection cells equals the average.

13. The system of claim 12, wherein redistributing causes the grid to be a local, non-matching grid, such that the intersection cell forms a border with the first and second cells as well as at least one matrix cell of the grid, wherein the at least one matrix cell also forms a border with the first cell.

14. The system of claim 13, wherein the operations further comprise determining a split transmissibility between the matrix cell, the first cell, and the intersection cell.

15. The system of claim 13, wherein the operations further comprise determining a transmissibility between the matrix cell and another matrix cell via the intersection cell.

16. A non-transitory computer-readable medium storing instructions that, when executed by one or more processors, are configured to cause the one or more processors to perform operations, comprising:
representing fractures defined in a matrix of a porous medium as fracture cells in a grid;
representing the matrix of the porous medium as matrix cells;
determining a location of an intersection cell formed where a first fracture of the fractures and a second fracture of the fractures intersect, wherein each of the fracture cells borders at least one of the matrix cells, except for the intersection cell which is free from borders with the matrix cells;
and enlarging the intersection cell, comprising:
removing at least a portion of at least one of the fracture cells positioned adjacent to the intersection cell; and
adding the removed at least a portion of the at least one of the fracture cells to the intersection cell, wherein the intersection cell forms a border with at least one of the matrix cells after enlarging;
determining transmissibility in non-matching portions of the grid, comprising generalizing the transmissibility between any two control volumes j and k from a transmissibility calculation for corner-point systems, using the following formulation:

$$T_{jk} = \frac{A_{c,jk} c_{jk} c_{kj}}{c_{jk} + c_{kj}}, \text{ where}$$

$$c_{jk} = \frac{A_{jk} K_j}{H_{jk}} n_j \cdot u_{jk},$$

where $A_{c,jk}$ is the contact area between control volumes j and k, $A_{jk}$ is a complete area of each neighbor, $K_j$ is the control volume j permeability, $H_{jk}$ is a distance between a centroid of the control volume j and a centroid of the interface between the control volumes j and k, $n_j$ is a unit normal vector to the interface inside block j, $u_{jk}$ is the unit vector along the line joining $O_j$ the block j center and centroid of the interface, and $A_{jk}$ is the area of the interface between control volumes j and k, wherein for adjacent control volumes in a fully-conformed mesh, the interface areas Ajk, Ajk and Ac,jk are equal; and simulating fluid flow based on the transmissibility.

17. The computer-readable medium of claim 16, wherein determining the location comprises representing the fractured medium in a grid space and in a computation space, wherein the first and second fractures are represented in n dimensions in the computational space and in n−1 dimensions in the grid space, and the fractured medium is represented in n dimensions in both the grid space and the computational space.

18. The computer-readable medium of claim 16, wherein enlarging the intersection cell further comprises:
- determining that the fracture cells representing the first fracture are larger than the fracture cells representing the second fracture; and
- selecting at least one of the fracture cells representing the first fracture as the at least one other fracture cell to remove at least a portion thereof and add to the intersection cell.

19. The computer-readable medium of claim 16, wherein redistributing comprises:
- selecting a first cell of the fracture cells representing the first fracture and a second cell of the fracture cells representing the first fracture, wherein the first and second cells are positioned adjacent to the intersection cell; and
- calculating an average for a dimension of the first cell, the second cell, and the intersection cell; and
- redistributing an area of the first cell, an area of the second cell, and an area of the intersection cell, such that the dimension for each of the first, second, and third cells equals the average.

20. The computer-readable medium of claim 16, further comprising determining a split transmissibility between the matrix cell, the first cell, and the intersection cell.

* * * * *